US012813295B2

(12) United States Patent
Song et al.

(10) Patent No.: US 12,813,295 B2
(45) Date of Patent: Nov. 24, 2026

(54) SEMICONDUCTOR PACKAGE INCLUDING THROUGH ELECTRODES

(71) Applicant: Samsung Electronics Co., Ltd., Suwon-si (KR)

(72) Inventors: Eunseok Song, Hwaseong-si (KR); Kyung Suk Oh, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 786 days.

(21) Appl. No.: 17/687,796

(22) Filed: Mar. 7, 2022

(65) Prior Publication Data

US 2022/0415775 A1 Dec. 29, 2022

(30) Foreign Application Priority Data

Jun. 28, 2021 (KR) ........................ 10-2021-0084202

(51) Int. Cl.

| | |
|---|---|
| ***H10W 70/63*** | (2026.01) |
| ***H10W 70/685*** | (2026.01) |
| ***H10W 90/00*** | (2026.01) |

(52) U.S. Cl.

CPC ....... *H10W 70/635* (2026.01); *H10W 70/685* (2026.01); *H10W 90/00* (2026.01); *H10W 90/721* (2026.01); *H10W 90/752* (2026.01)

(58) Field of Classification Search

CPC ......... H01L 23/49827; H01L 23/49822; H01L 25/0657; H01L 2225/06506; H01L 23/481; H01L 23/49838; H01L 25/0652; H01L 23/5226; H10W 70/635; H10W 70/685; H10W 90/00; H10W 90/721; H10W 90/752

USPC ............... 257/686, 774, 777, 23.011, 23.174

See application file for complete search history.

(56) References Cited

U.S. PATENT DOCUMENTS

| | | | |
|---|---|---|---|
| 8,653,645 B2 | 2/2014 | Yamaoka et al. | |
| 9,054,166 B2 | 6/2015 | Hsieh et al. | |
| 9,087,822 B2 | 7/2015 | Furuta et al. | |
| 9,299,640 B2 | 3/2016 | Lin | |
| 9,397,073 B1 * | 7/2016 | England .................. | H01L 24/14 |

(Continued)

FOREIGN PATENT DOCUMENTS

| | | |
|---|---|---|
| JP | 2018-148175 A | 9/2018 |
| KR | 10-2011-0131578 A | 12/2011 |

*Primary Examiner* — David Chen

(74) *Attorney, Agent, or Firm* — Wolf, Greenfield & Sacks, P.C.

(57) ABSTRACT

A semiconductor package is disclosed. The semiconductor package may include a package substrate, an upper semiconductor chip on the package substrate, and a lower semiconductor chip between the package substrate and the upper semiconductor chip. The upper semiconductor chip may include a core region having a power circuit thereon and a logic cell region having a logic circuit thereon. The lower semiconductor chip may include a power wire region vertically overlapping the core region. The lower semiconductor chip may include a first substrate, a first through electrode, and a second through electrode, the first substrate including an active surface having an integrated circuit thereon, and a first through electrode and a second through electrode penetrating the first substrate in the power wire region. A distance between the first and second through electrodes may be smaller than a width of the first through electrode.

20 Claims, 16 Drawing Sheets

(56) References Cited

U.S. PATENT DOCUMENTS

| | | | | |
|---|---|---|---|---|
| 10,002,820 | B2 | 6/2018 | Jan et al. | |
| 2011/0042795 | A1* | 2/2011 | Knickerbocker | H01L 23/49827 257/E21.585 |
| 2011/0204917 | A1* | 8/2011 | O'Neill | H03K 19/17796 326/38 |
| 2011/0221009 | A1* | 9/2011 | Chuang | H10D 64/691 257/E27.06 |
| 2013/0069242 | A1 | 3/2013 | Yuh et al. | |
| 2014/0264918 | A1* | 9/2014 | Huang | H01L 23/5286 257/774 |
| 2014/0319662 | A1* | 10/2014 | You | H01L 23/49816 257/665 |
| 2016/0181201 | A1* | 6/2016 | Yang | H01L 21/76898 257/737 |
| 2017/0069601 | A1* | 3/2017 | Park | H10D 1/68 |
| 2020/0135617 | A1* | 4/2020 | Shen | H10F 39/809 |

* cited by examiner

SEMICONDUCTOR PACKAGE INCLUDING THROUGH ELECTRODES

CROSS-REFERENCE TO RELATED APPLICATIONS

This U.S. non-provisional patent application claims priority under 35 U.S.C. § 119 to Korean Patent Application No. 10-2021-0084202, filed on Jun. 28, 2021, in the Korean Intellectual Property Office, the entire contents of which are hereby incorporated by reference.

BACKGROUND

The present disclosure relates to a semiconductor package, and in particular, to a semiconductor package including a through electrode.

A semiconductor package includes a substrate and a plurality of semiconductor chips stacked on the substrate. The semiconductor chip may include an integrated circuit composed of metal oxide semiconductor field effect transistors (MOS-FETs). To meet an increasing demand for a semiconductor device with a small pattern size and a reduced design rule, the MOS-FETs are being aggressively scaled down. The scale-down of the MOS-FETs may lead to deterioration in operational properties of the semiconductor device. A variety of studies are being conducted to overcome technical limitations, which are associated with the scale-down of the semiconductor device, and to realize a high-performance semiconductor device and a semiconductor package including the same.

SUMMARY

An example embodiment of the inventive concepts provides a semiconductor package with an increased integration density.

According to an example embodiment of the inventive concepts, a semiconductor package includes a package substrate, an upper semiconductor chip on the package substrate, and a lower semiconductor chip between the package substrate and the upper semiconductor chip. The upper semiconductor chip may include a core region having a power circuit thereon and a logic cell region having a logic circuit thereon. The lower semiconductor chip may include a power wire region vertically overlapping the core region. The lower semiconductor chip may include a first substrate, a first through electrode, and a second through electrode, the first substrate including an active surface having an integrated circuit thereon, and the first through electrode and the second through electrode penetrating the first substrate in the power wire region. A distance between the first and second through electrodes may be smaller than a width of the first through electrode.

According to an example embodiment of the inventive concepts, a semiconductor package includes a package substrate, a lower semiconductor chip on the package substrate, the lower semiconductor chip including a power wire region and a signal wire region, and an upper semiconductor chip on the lower semiconductor chip, the upper semiconductor chip including a core region vertically overlapping the power wire region. The lower semiconductor chip may include a first substrate, an integrated circuit on the first substrate, signal through electrodes penetrating the signal wire region of the first substrate and electrically connected to the integrated circuit, and power through electrodes provided to penetrate the power wire region of the first substrate to electrically connect the core region to the package substrate. A distance between adjacent two of the power through electrodes may be smaller than a distance between adjacent two of the signal through electrodes.

According to an example embodiment of the inventive concepts, a semiconductor package includes a package substrate, a first semiconductor chip on the package substrate, and a second semiconductor chip on the first semiconductor chip. The first semiconductor chip may include a power wire region and a signal wire region, and the second semiconductor chip may include a core region and a logic cell region. The power wire region may vertically overlap the core region. The first semiconductor chip may include a first substrate, an integrated circuit on the first substrate, an interlayer insulating layer covering the integrated circuit, an interconnection layer on the interlayer insulating layer, signal through electrodes in the signal wire region, and power through electrodes penetrating the power wire region of the first substrate and to electrically connect the core region to the package substrate. The signal through electrodes may penetrate the first substrate and the interlayer insulating layer and may be electrically connected to the interconnection layer. The second semiconductor chip may include a second substrate having an active surface facing the first semiconductor chip, and an inactive surface opposite to the active surface, a logic transistor on the active surface of the logic cell region, and a power transistor on the active surface of the core region. The logic transistor may include a first gate electrode having a first width. The power transistor may include a second gate electrode that has a second width larger than the first width.

DETAILED DESCRIPTION

Example embodiments of the inventive concepts will now be described more fully with reference to the accompanying drawings, in which some example embodiments are shown.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
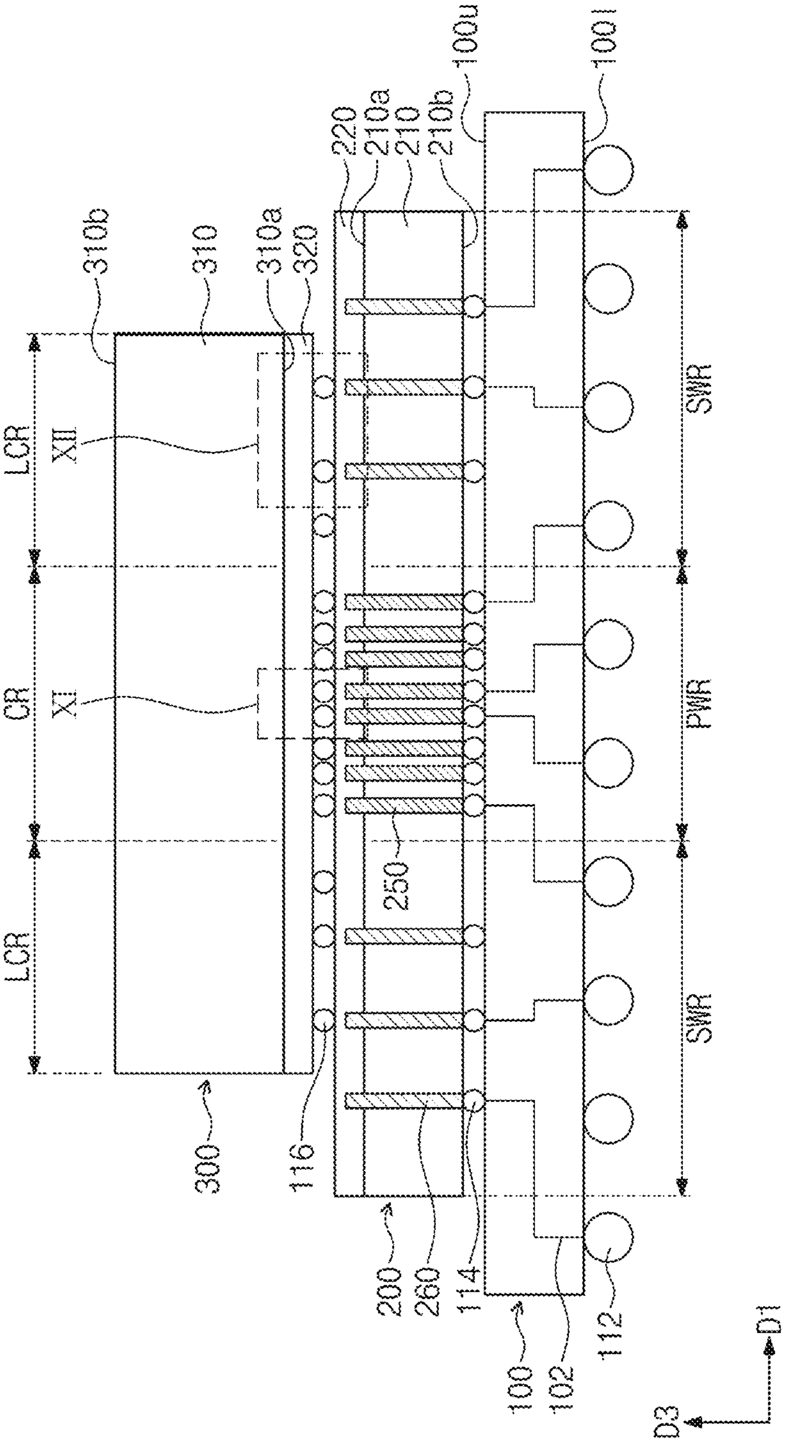
FIG. 1 is a sectional view illustrating a semiconductor package according to an example embodiment of the inventive concepts.
Figure 2:
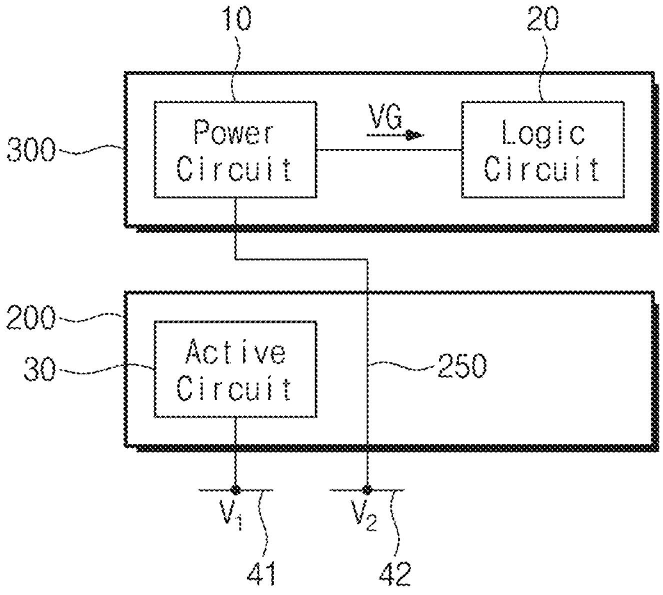
FIG. 2 is a block diagram schematically illustrating a semiconductor package according to an example embodiment of the inventive concepts.

FIG. 1 is a sectional view illustrating a semiconductor package according to an example embodiment of the inventive concepts. FIG. 2 is a block diagram schematically illustrating a semiconductor package according to an example embodiment of the inventive concepts.

Referring to FIGS. 1 and 2, a semiconductor package may include a package substrate 100, a first semiconductor chip 200 mounted on the package substrate 100, and a second semiconductor chip 300 stacked on the first semiconductor chip 200. The first semiconductor chip 200 may be referred to as a lower semiconductor chip, and the second semiconductor chip 300 may be referred to as an upper semiconductor chip. The package substrate 100 may have a top surface 100*u*, on which the first semiconductor chip 200 is mounted, and a bottom surface 1001, which is opposite to the top surface 100*u*. First connection members 114 may be disposed on the top surface 100*u* of the package substrate 100. The package substrate 100 may be connected to the first semiconductor chip 200 through the first connection members 114. Outer connection members 112 may be disposed on the bottom surface 1001 of the package substrate 100. The package substrate 100 may be connected to an external device through the outer connection members 112. The package substrate 100 may have internal wires 102, which electrically connect the first connection members 114 to the outer connection members 112. Although not shown, some of the internal wires 102 may electrically connect the first connection members 114 to each other. In an example embodiment, the package substrate 100 may include a printed circuit board (PCB).

The first semiconductor chip 200 may include a first substrate 210, a first interconnection layer 220 on the first substrate 210, and through electrodes 250 and 260 penetrating the first substrate 210. The first substrate 210 may have a first active surface 210*a*, on which integrated circuits are formed, and a first inactive surface 210*b*, which is opposite to the first active surface 210*a*. The first active surface 210*a* may face the second semiconductor chip 300, and the first inactive surface 210*b* may face the package substrate 100. The first semiconductor chip 200 may include an active circuit 30, which is operated by a first power voltage $V_1$ provided from an external device. The active circuit 30 may include one of, for example, a memory circuit, a logic circuit, or combinations thereof. The active circuit 30 may include an integrated circuit. The first power voltage $V_1$ from an external device may be provided to the first semiconductor chip 200 through a first power line 41. The first power line 41 may include the internal wires 102 of the package substrate 100.

The second semiconductor chip 300 may include a second substrate 310 and a second interconnection layer 320 on the second substrate 310. The second substrate 310 may have a second active surface 310*a*, on which integrated circuits are formed, and a second inactive surface 310*b*, which is opposite to the second active surface 310*a*. The second active surface 310*a* may face the first semiconductor chip 200. That is, the second semiconductor chip 300 may be mounted on the first semiconductor chip 200 in a face-down manner. The second semiconductor chip 300 may include a core region CR and a logic cell region LCR. The second semiconductor chip 300 may be connected to the first semiconductor chip 200 through second connection members 116.

The second semiconductor chip 300 may include a power circuit 10 and a logic circuit 20, which are operated by a second power voltage $V_2$ provided from an external device. The power circuit 10 may be disposed in the core region CR of the second semiconductor chip 300. The logic circuit 20 may be disposed in the logic cell region LCR of the second semiconductor chip 300. The power circuit 10 may receive the second power voltage $V_2$ through the through electrodes 250 penetrating the first substrate 210 of the first semiconductor chip 200. The power circuit 10 may be configured to generate a gating voltage VG and to provide the gating voltage VG to the logic circuit 20. The logic circuit 20 may be driven by the gating voltage VG provided from the power circuit 10.

Figure 3:
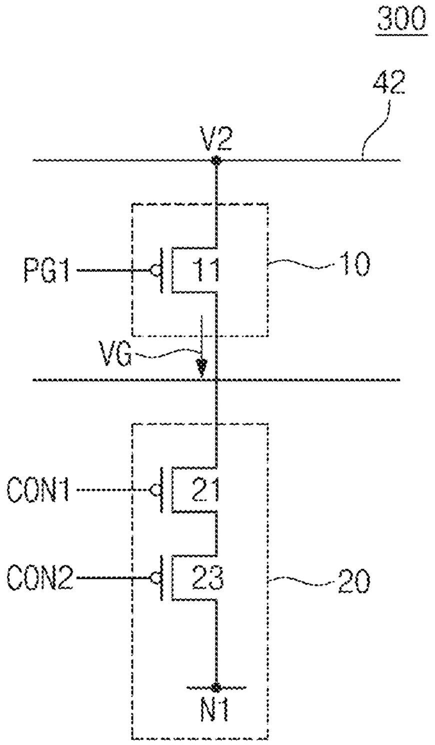
FIG. 3 is a circuit diagram schematically illustrating a second semiconductor chip according to an example embodiment of the inventive concepts.

FIG. 3 is a circuit diagram schematically illustrating a second semiconductor chip according to an example embodiment of the inventive concepts.

For example, referring to FIGS. 2 and 3, the power circuit 10 may be a power gating circuit, which is configured to selectively provide or interrupt the second power voltage $V_2$ to the logic circuit 20. When the power circuit 10 is in a turn-on state, the second power voltage $V_2$ may be supplied as the gating voltage VG, and when it is in a turn-off state, the supplying of the second power voltage $V_2$ may be interrupted. The power circuit 10 may include a power transistor 11 connecting a second power line 42 to the logic circuit 20. The power transistor 11 may be turned on or off, depending on a power gating control signal PG1.

The logic circuit 20 may include a plurality of logic transistors 21 and 23, which are provided between and connected to the power circuit 10 and a first node Ni. For example, the logic transistors 21 and 23 may include first and second logic transistors 21 and 23 that are connected in series. The first and second logic transistors 21 and 23 may be operated in response to first and second control signals CON1 and CON2, respectively. In an example embodiment, the logic transistors 21 and 23 may be designed and connected in a standard cell manner Thus, according to the function of the standard cell, the logic circuit 20 may include three or more logic transistors 21 and 23, which are connected in series or parallel. For example, the logic circuit 20 may be configured to receive the gating voltage VG and may be operated as a flipflop, a latch, and an amplifier.

Figure 4:
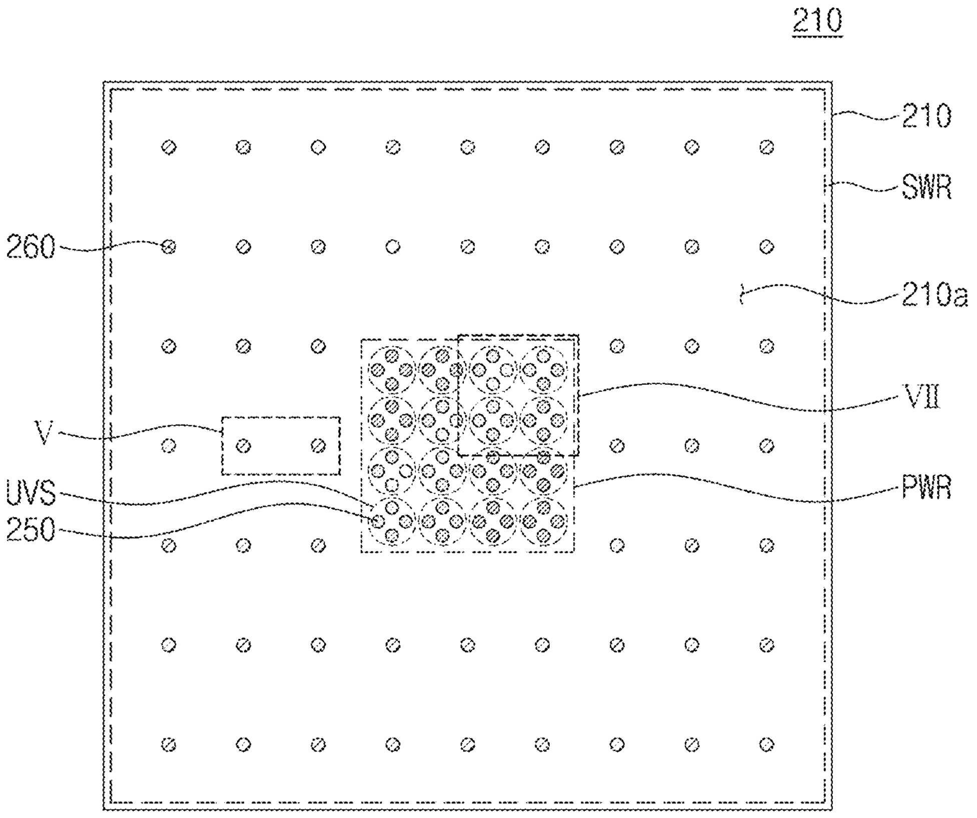
FIG. 4 is a top plan view illustrating an active surface of a first substrate of a first semiconductor chip according to an example embodiment of the inventive concepts.

FIG. 4 is a top plan view illustrating an active surface of a first substrate of a first semiconductor chip according to an example embodiment of the inventive concepts.

Referring to FIGS. 1 and 4, the first substrate 210 may include a power wire region PWR and a signal wire region SWR. The power wire region PWR may be formed in a center portion of the first substrate 210. The signal wire region SWR may be provided to enclose the power wire region PWR, when viewed in a plan view.

The through electrodes 250 and 260 may be provided in the power wire region PWR and the signal wire region SWR. The through electrodes 250 and 260 may include signal through electrodes 260, which are provided to penetrate the first substrate 210 of the signal wire region SWR, and power through electrodes 250, which are provided to penetrate the first substrate 210 of the power wire region PWR. The signal through electrodes 260 may be used to exchange signals between the package substrate 100, the first semiconductor chip 200, and the second semiconductor chip 300. Some of the signal through electrodes 260 may connect the package substrate 100 to an active circuit, which is formed on the first active surface 210*a* of the first semiconductor chip 200. Others of the signal through electrodes 260 may connect the package substrate 100 to an active circuit, which is formed on the second active surface 310*a* of the second semiconductor chip 300.

The power through electrodes 250 may be used to exchange a power voltage between the package substrate 100, the first semiconductor chip 200, and the second semiconductor chip 300. For example, some of the power through electrodes 250 may provide the power voltage, which is supplied from the package substrate 100, to the first semiconductor chip 200. Others of the power through electrodes 250 may provide the power voltage, which is supplied from the package substrate 100, to the second semiconductor chip 300.

The power through electrodes 250 may be regularly arranged to constitute a plurality of unit through electrode structures UVS. In other words, the power wire region PWR may include the unit through electrode structures UVS, and each of the through electrode structures UVS may include the power through electrodes 250 which are arranged in a specific shape. A density of the power through electrodes 250 may be higher than that of the signal through electrodes 260. For example, a distance between adjacent two of the power through electrodes 250 in one through electrode structure UVS may be smaller than a distance between adjacent two of the signal through electrodes 260.

Figure 5:
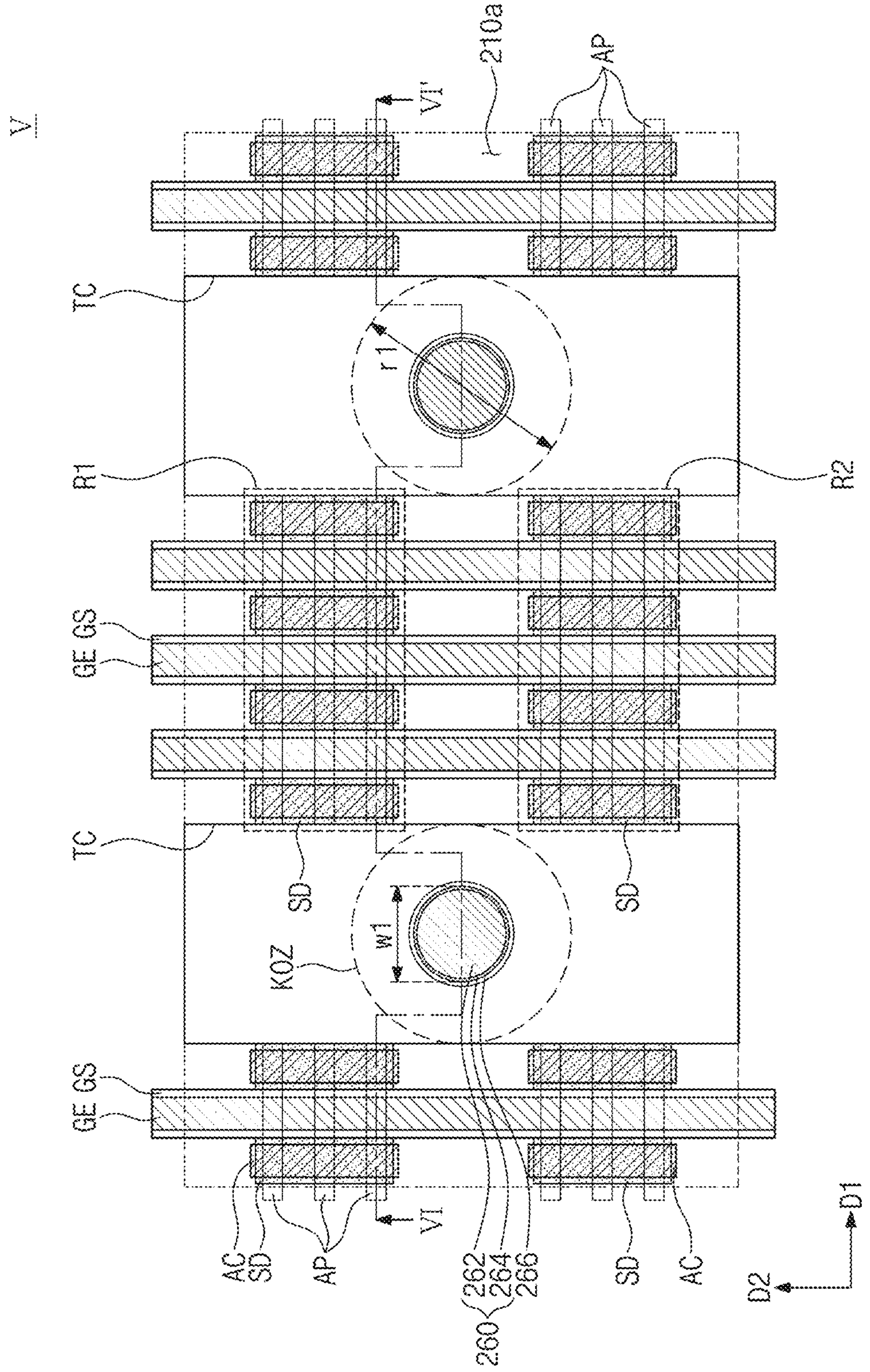
FIG. 5 is an enlarged plan view illustrating a portion 'V' of FIG. 4.
Figure 6:
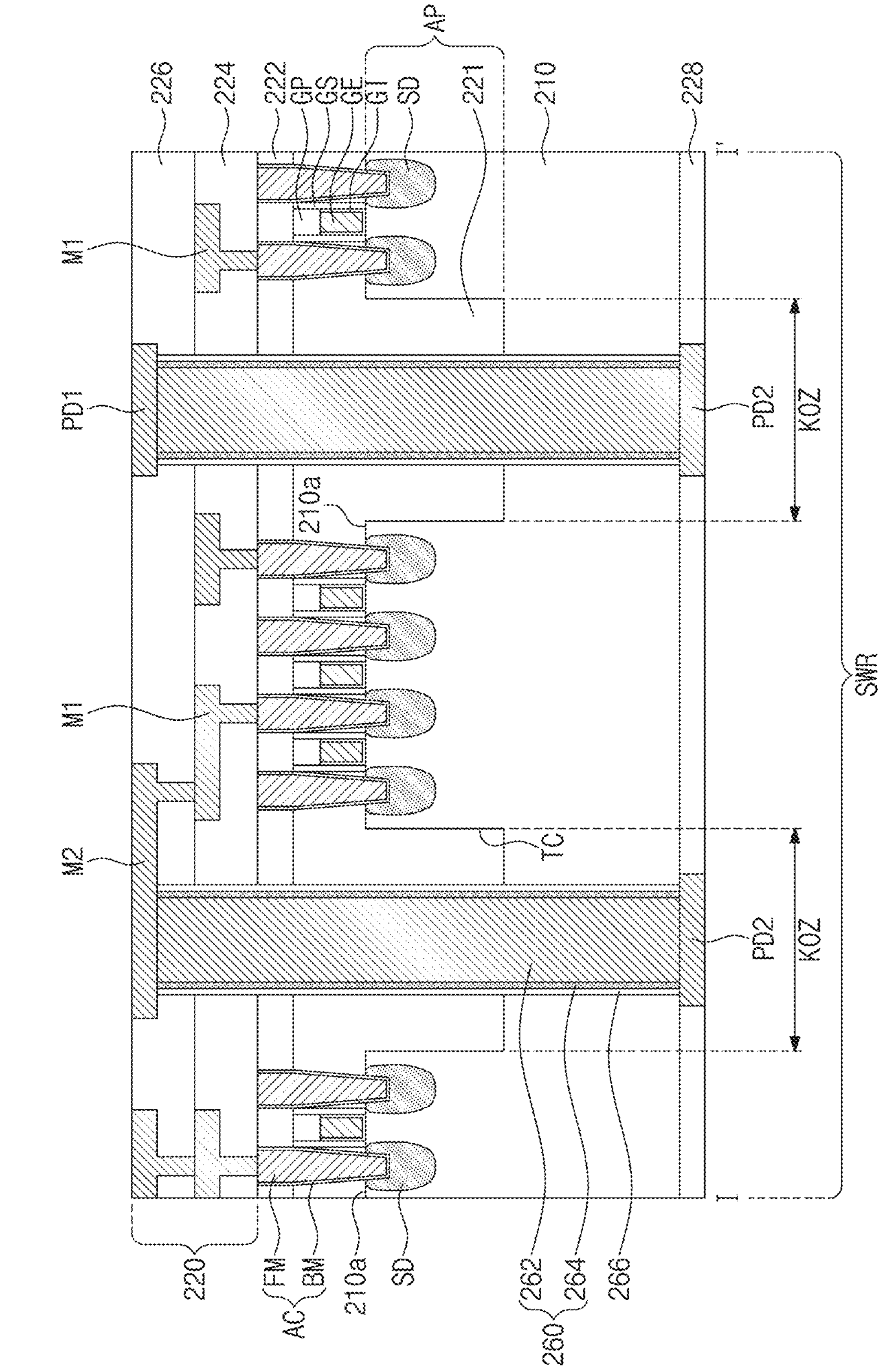
FIG. 6 is a sectional view, which is taken along a line VI-VI' of FIG. 5 to illustrate a first semiconductor chip according to an example embodiment of the inventive concepts.

FIG. 5 is an enlarged plan view illustrating a portion 'V' of FIG. 4. FIG. 6 is a sectional view, which is taken along a line VI-VI' of FIG. 5 to illustrate a first semiconductor chip according to an example embodiment of the inventive concepts.

The signal wire region SWR of the first semiconductor chip 200 will be described in more detail with reference to FIGS. 1 and 4 to 6. The signal wire region SWR may include the active circuits 30 (e.g., see FIG. 2) formed on the first substrate 210. For example, the first substrate 210 may include a first active region R1 and a second active region R2, which are provided on the signal wire region SWR. The first active region R1 may be a PMOSFET region, and a second active region NR may be an NMOSFET region. The first substrate 210 may be a semiconductor substrate which is formed of at least one of silicon (Si), germanium (Ge), silicon-germanium (Si—Ge), or compound semiconductor materials. For example, the first substrate 210 may be a silicon wafer.

Active patterns AP may be provided on each of the first and second active regions R1 and R2. The active patterns AP may be extended in a first direction D1 to be parallel to each other. The active patterns AP may be portions of the first substrate 210 that vertically protrude in a direction away from the inactive surface 210*b* of the first substrate 210. Each of upper portions of the active patterns AP may be shaped like a fin.

Source/drain patterns SD may be provided in upper portions of the active patterns AP. A channel pattern may be interposed between the source/drain patterns SD. The source/drain patterns SD may be epitaxial patterns which are formed by a selective epitaxial growth process. As an example, top surfaces of the source/drain patterns SD may be coplanar with top surfaces of the channel patterns. As another example, the top surfaces of the source/drain patterns SD may be located at a level higher than the top surfaces of the channel patterns. The source/drain patterns SD on the first active region R1 may be formed of or include a semiconductor material (e.g., SiGe) whose lattice constant is larger than that of a semiconductor material of the first substrate 210. Thus, the source/drain patterns SD on the first active region R1 may exert a compressive stress on the channel patterns. The source/drain patterns SD on the second active region R2 may be formed of or include the same semiconductor material (e.g., Si) as the package substrate 100.

Gate electrodes GE may be provided on the active patterns AP. The gate electrodes GE may be extended in a second direction D2 to cross the active patterns AP. The gate electrodes GE may be arranged in the first direction D1 to have a specific pitch. The gate electrodes GE may vertically overlap the channel patterns. Each of the gate electrodes GE may be provided to enclose each of the channel patterns or to face a top surface and opposite side surfaces of each of the channel patterns.

A pair of gate spacers GS may be disposed on opposite side surfaces of each of the gate electrodes GE. The gate spacers GS may be extended along the gate electrodes GE and in the second direction D2. The gate spacers GS may have top surfaces that are located at a level higher than top surfaces of the gate electrodes GE. The top surfaces of the gate spacers GS may be coplanar with a top surface of a first interlayer insulating layer 221. The gate spacers GS may be formed of or include at least one of carbonitride (SiCN), silicon carbon oxynitride (SiCON), or silicon nitride (SiN).

A gate capping pattern GP may be provided on each of the gate electrodes GE. The gate capping pattern GP may be extended along the gate electrode GE and in the second direction D2. The gate capping pattern GP may be formed of or include a material having an etch selectivity with respect to first and second interlayer insulating layers 221 and 222, which will be described below. For example, the gate capping patterns GP may be formed of or include at least one of silicon oxynitride (SiON), silicon carbonitride (SiCN), silicon carbon oxynitride (SiCON), or silicon nitride (SiN).

A gate insulating layer GI may be interposed between the gate electrode GE and the active pattern AP. The gate insulating layer GI may be extended along a bottom surface of the gate electrode GE, which is placed on the gate insulating layer GI. The gate insulating layer GI may be formed of or include a high-k dielectric material having a higher dielectric constant than silicon oxide. For example, the high-k dielectric materials may include hafnium oxide ($HfO_2$), hafnium zirconium oxide ($HfZrO_2$), zirconium oxide ($ZrO_2$), zirconium silicon oxide ($ZrSiO_4$), tantalum oxide (TaO), or titanium oxide (TiO).

The first interlayer insulating layer 221 may be provided on the first substrate 210. The first interlayer insulating layer 221 may cover the gate spacers GS and the source/drain patterns SD. The top surface of the first interlayer insulating layer 221 may be coplanar with the top surfaces of the gate capping patterns GP and the top surfaces of the gate spacers GS. A second interlayer insulating layer 222 may be provided on the first interlayer insulating layer 221 to cover the gate capping patterns GP. The first and second interlayer insulating layers 221 and 222 may include a silicon oxide layer.

Active contacts AC may be provided to penetrate the first interlayer insulating layer 221 and the second interlayer insulating layer 222 and may be electrically connected to the source/drain patterns SD, respectively. Each of the active contacts AC may be provided between a pair of the gate electrodes GE. The active contact AC may be a self-aligned contact. In other words, the active contact AC may be formed in a self-aligned manner, using the gate capping pattern GP and the gate spacer GS. For example, the active contact AC may cover at least a portion of a side surface of the gate spacer GS.

The active contact AC may include a conductive pattern FM and a barrier pattern BM enclosing the conductive pattern FM. The barrier pattern BM may be provided to cover side and bottom surfaces of the conductive pattern FM. The conductive pattern FM may be formed of or include at least one of metallic materials (e.g., aluminum (Al), copper (Cu), tungsten (W), molybdenum (Mo), and cobalt (Co)). The barrier pattern BM may include a metal nitride layer or may include a metal layer and a metal nitride layer. The metal layer may be formed of or include at least one of titanium (Ti), tantalum (Ta), tungsten (W), nickel (Ni), cobalt (Co), or platinum (Pt). The metal nitride layer may be formed of or include at least one of titanium nitride (TiN), tantalum nitride (TaN), tungsten nitride (WN), nickel nitride (NiN), cobalt nitride (CoN), or platinum nitride (PtN).

In an example embodiment, an interface layer may be interposed between the active contact AC and the source/drain pattern SD. The active contact AC may be electrically connected to the source/drain pattern SD through the interface layer. The interface layer may be formed of or include at least one of metal-silicide materials. For example, the interface layer may be formed of or include at least one of titanium silicide, tantalum silicide, tungsten silicide, nickel silicide, or cobalt silicide.

The first interconnection layer 220 may be provided on the second interlayer insulating layer 222. The first interconnection layer 220 may include a first upper insulating layer 224, a second upper insulating layer 226, first wire patterns M1, and second wire patterns M2. The first upper insulating layer 224 and the second upper insulating layer 226 may be formed of or include at least one of silicon oxide (SiO) or silicon nitride (SiN). The first wire patterns M1 may be formed in the first upper insulating layer 224 and may be electrically connected to the active contact AC. The second wire patterns M2 may be formed in the second upper insulating layer 226 and may be electrically connected to the first wire patterns M1. The first wire patterns M1 and the second wire patterns M2 may be formed of or include at least one of metallic materials (e.g., copper (Cu), tungsten (W), aluminum (Al), or combinations thereof). For example, the first wire patterns M1 and the second wire patterns M2 may be copper patterns which are formed by a damascene process.

Trenches TC may be formed in an upper portion of the first substrate 210 to separate the active patterns AP from each other in the second direction D2. The trenches TC may be filled with the first interlayer insulating layer 221.

The signal through electrodes 260 may be provided on the trenches TC, respectively. Each of the signal through electrodes 260 may penetrate the first interlayer insulating layer 221 filling the trench TC and the first substrate 210 below the trench TC. The signal through electrode 260 may be provided below a top surface of the first interconnection layer 220. The signal through electrode 260 may be vertically extended from a region below the second upper insulating layer 226 to a bottom surface of the first substrate 210.

A keep out zone KOZ may be defined around the signal through electrode 260. The keep out zone KOZ may be a region, on which integrated circuits are not disposed, and which is provided to mitigate or prevent a failure caused by the through electrodes 250 and 260. The keep out zone KOZ may be defined to have a circular shape, when viewed in a plan view. The keep out zone KOZ may overlap the trench TC, and a width of the trench TC may not be smaller than a diameter r1 of the keep out zone KOZ. The diameter r1 of the keep out zone KOZ may be set to have a value different from a width w1 of the signal through electrode 260. The diameter r1 of the keep out zone KOZ may range about two to about four times the width w1 of the signal through electrode 260. For example, the width w1 of the signal through electrode 260 may range from about 3 μm to about 7 μm, and the diameter r1 of the keep out zone KOZ may range from about 6 μm to about 30 μm. By controlling a size and a position of the keep out zone KOZ, it may be possible to increase an integration density of a semiconductor package.

The signal through electrode 260 may include a conductive pattern 262, a barrier pattern 264 enclosing the conductive pattern 262, and an insulating spacer 266. The conductive pattern 262 may be shaped like a vertically-extended pillar. The barrier pattern 264 may be provided to enclose an outer sidewall of the conductive pattern 262. The barrier pattern 264 may not cover top and bottom surfaces of the conductive pattern 262. The insulating spacer 266 may be provided to enclose an outer sidewall of the barrier pattern 264. The conductive pattern 262 may be formed of or include at least one metal of aluminum, copper, tungsten, molybdenum, or cobalt. The barrier pattern 264 may include a metal nitride layer or may include a combination of a metal layer and a metal nitride layer.

A top surface of the signal through electrode 260 may be located at a level that is higher than top surfaces of the first wire patterns M1 and is lower than top surfaces of the second wire patterns M2. A bottom surface of the signal through electrode 260 may be located at a level that is not lower than the bottom surface of the first substrate 210 (e.g., the first inactive surface 210*b*). One of the signal through electrodes 260 may be electrically connected to a corresponding one of the second wire patterns M2. The top surface of one of the signal through electrodes 260 may be in contact with a bottom surface of the second wire pattern M2. One of the signal through electrodes 260 may be electrically connected to the active contact AC through the first wire pattern M1 and the second wire pattern M2. Another of the signal through electrodes 260 may be electrically connected to a first pad PD1 which is provided in the second upper insulating layer 226.

A passivation layer 228 may be provided on the first inactive surface 210*b* of the first substrate 210. The passivation layer 228 may cover the first inactive surface 210*b* of the first substrate 210. The passivation layer 228 may be formed of or include at least one of silicon oxide (SiO) or silicon nitride (SiN). Second pads PD2 may be provided on the first inactive surface 210*b* of the first substrate 210. Side surfaces of the second pads PD2 may be covered with the passivation layer 228. The signal through electrodes 260 may be electrically connected to the second pad PD2.

Figure 7:
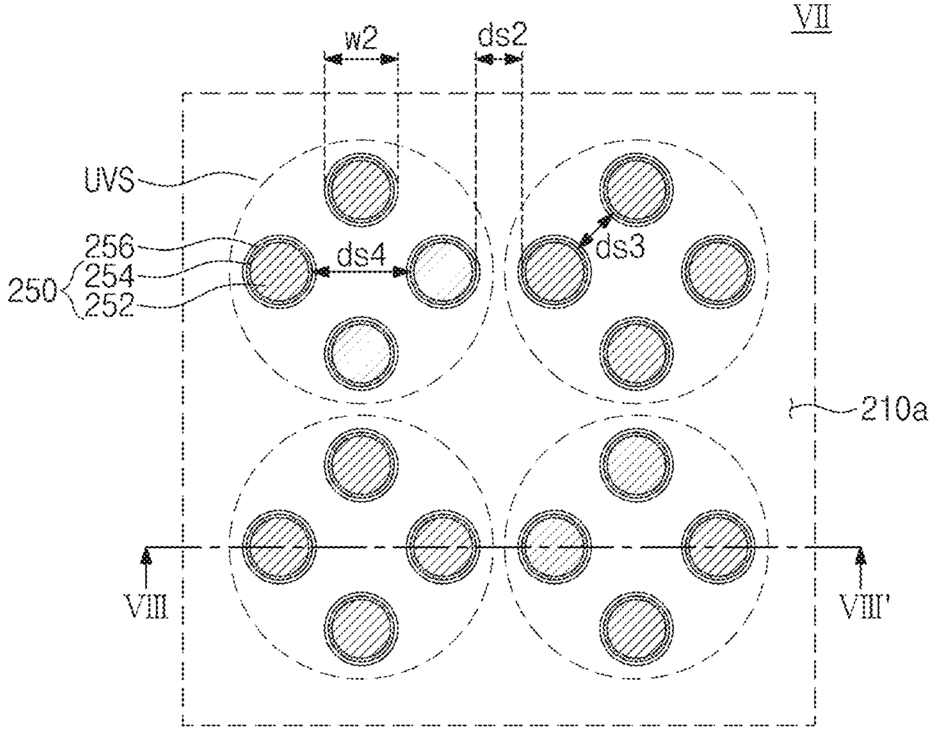
FIG. 7 is an enlarged plan view illustrating a portion 'VII' of FIG. 4.
Figure 8:
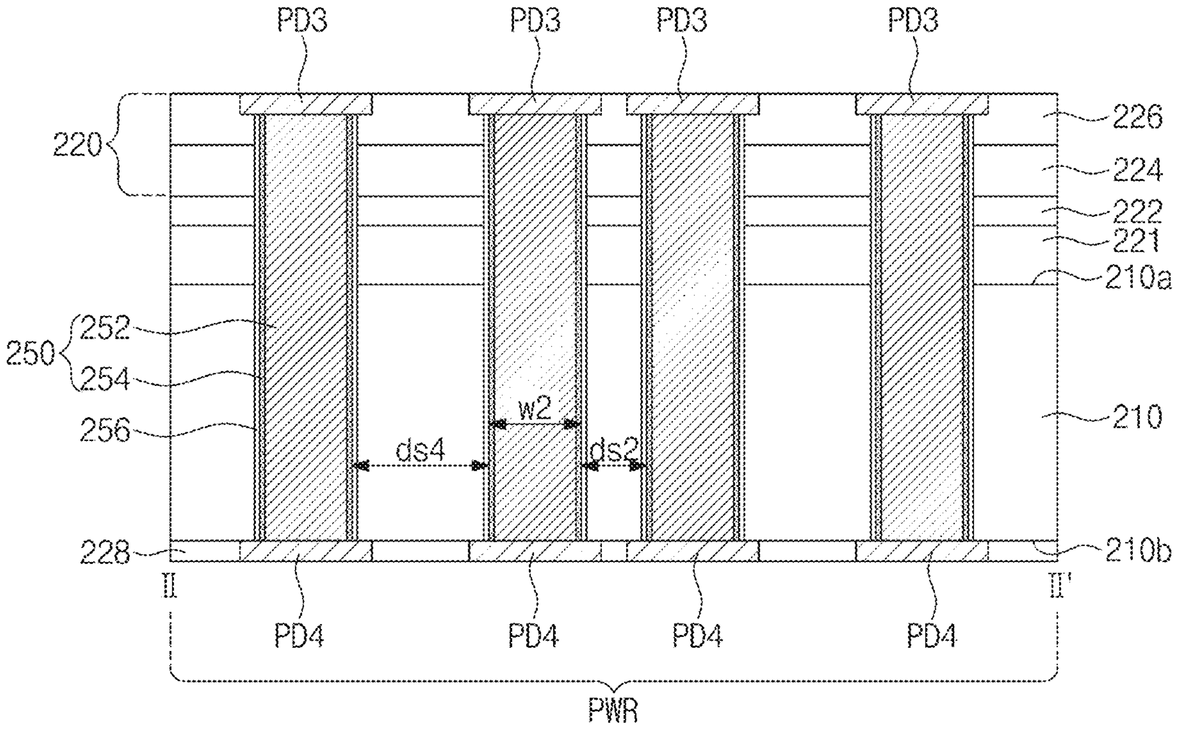
FIG. 8 is a sectional view, which is taken along a line VIII-VIII' of FIG. 7 to illustrate a first semiconductor chip according to an example embodiment of the inventive concepts.

FIG. 7 is an enlarged plan view illustrating a portion 'VII' of FIG. 4. FIG. 8 is a sectional view, which is taken along a line VIII-VIII' of FIG. 7 to illustrate a first semiconductor chip according to an example embodiment of the inventive concepts.

The power wire region PWR of the first semiconductor chip 200 will be described in more detail with reference to FIGS. 1, 4, 7, and 8. The first interlayer insulating layer 221, the second interlayer insulating layer 222, the first upper insulating layer 224, and the second upper insulating layer 226 may be sequentially stacked on the first substrate 210 of the power wire region PWR. Third pads PD3 may be provided in the second upper insulating layer 226. Fourth pads PD4 may be provided on the first inactive surface 210*b* of the first substrate 210. The power through electrodes 250 may be vertically extended between the third pads PD3 and the fourth pads PD4 to electrically connect the third pads PD3 to the fourth pads PD4. The power through electrodes 250 may be provided to penetrate the first substrate 210, the first interlayer insulating layer 221, the second interlayer insulating layer 222, the first upper insulating layer 224, and the second upper insulating layer 226.

The power wire region PWR may include a plurality of unit through electrode structures UVS. Each of the unit through electrode structures UVS may include the power through electrodes 250 which are disposed to be adjacent to each other. A planar area of the keep out zone, which is defined by adjacent ones of the power through electrodes 250 (e.g., the power through electrodes 250 included in a unit through electrode structure UVS), may be larger than a sum of the planar area of the keep out zone defined by each of the power through electrodes 250. That is, by disposing the power through electrodes 250 to be adjacent to each other, it may be possible to increase the planar area of the keep out zone relative to the number of the power through electrodes 250. The power wire region PWR may not include the active circuits 30 (e.g., see FIG. 2). That is, the active circuits 30 of the first semiconductor chip 200 (e.g., see FIG. 2) may be formed to be spaced apart from the power wire region PWR. Thus, the disposition of the unit through electrode structures UVS in the power wire region PWR may not be limited by the keep out zone.

In an example embodiment, each of the unit through electrode structures UVS may include four power through electrodes 250. The power through electrodes 250 may be arranged to have a diamond shape in the unit through electrode structure UVS. Each of the power through electrodes 250 may have a width w2 ranging from about 3 μm to about 7 μm. A distance ds4 between a pair of the power through electrodes 250, which are provided in the unit through electrode structure UVS and are spaced apart from each other in a diagonal direction, may range from about 4 μm to about 8 μm. A distance ds3 between a pair of the power through electrodes 250, which are provided in the unit through electrode structure UVS and are adjacent to each other, may range from about 2 μm to about 4 μm. A distance ds2 between a pair of the power through electrodes 250, which are provided in the power wire region PWR and are most adjacent to each other, may range from about 0.5 μm to about 2 μm.

The power through electrode 250 may include a conductive pattern 252, a barrier pattern 254 enclosing the conductive pattern 252, and an insulating spacer 256. In an example embodiment, the conductive pattern 252, the barrier pattern 254, and the insulating spacer 256 of the power through electrode 250 may be respectively formed of or include the same material as the conductive pattern 262, the barrier pattern 264, and the insulating spacer 266 of the signal through electrode 260. In an example embodiment, the power through electrode 250 may be formed by the same fabrication process as that for the signal through electrode 260.

Figure 9:
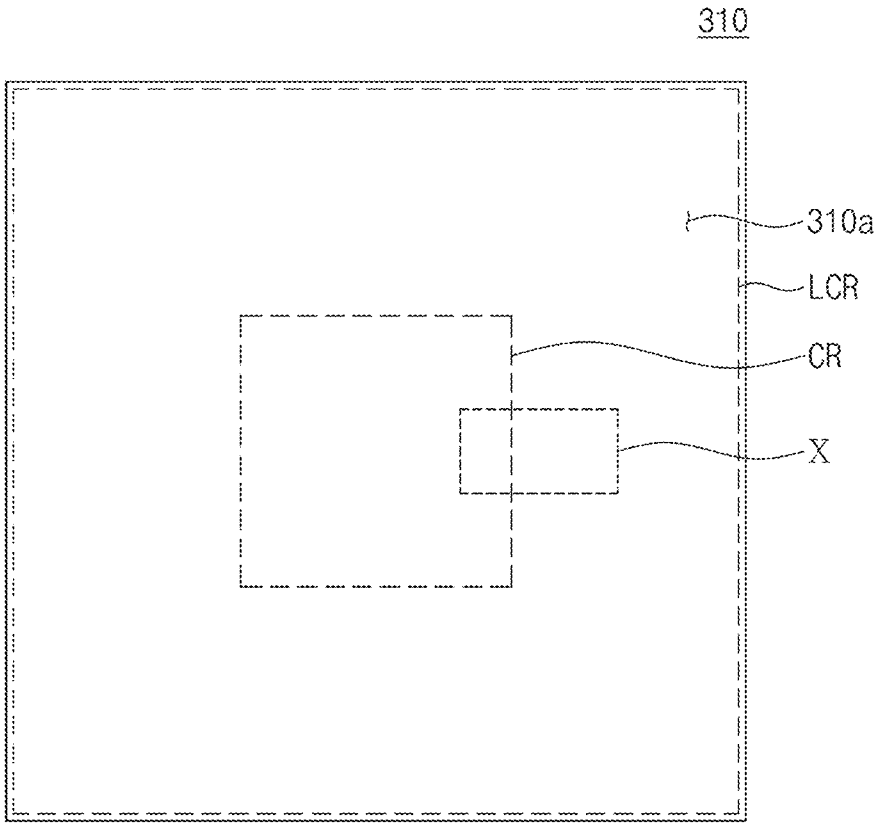
FIG. 9 is a bottom plan view illustrating a second active surface of a second semiconductor chip.
Figure 10:
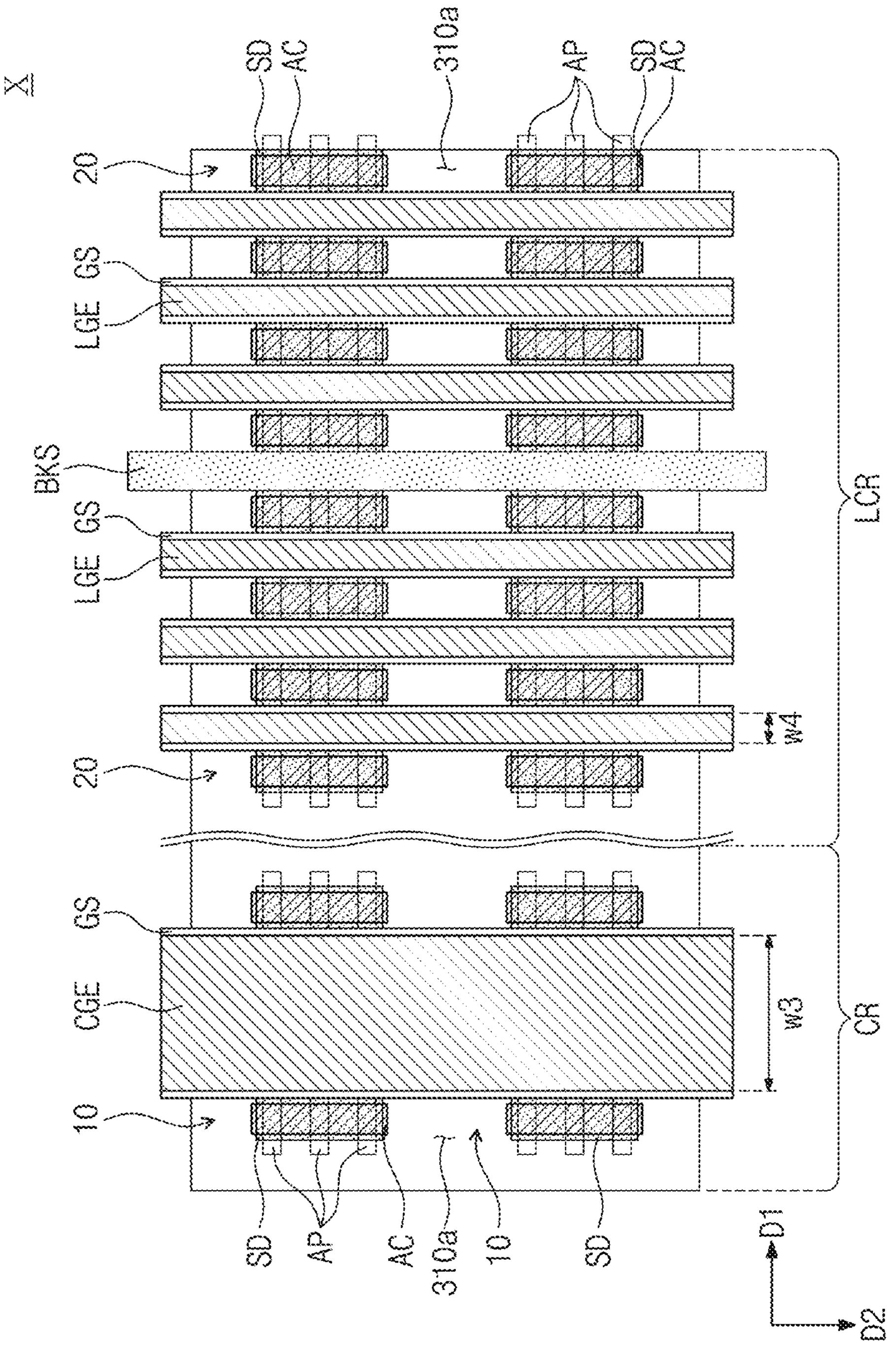
FIG. 10 is an enlarged plan view illustrating a portion 'X' of FIG. 9.
Figure 11:
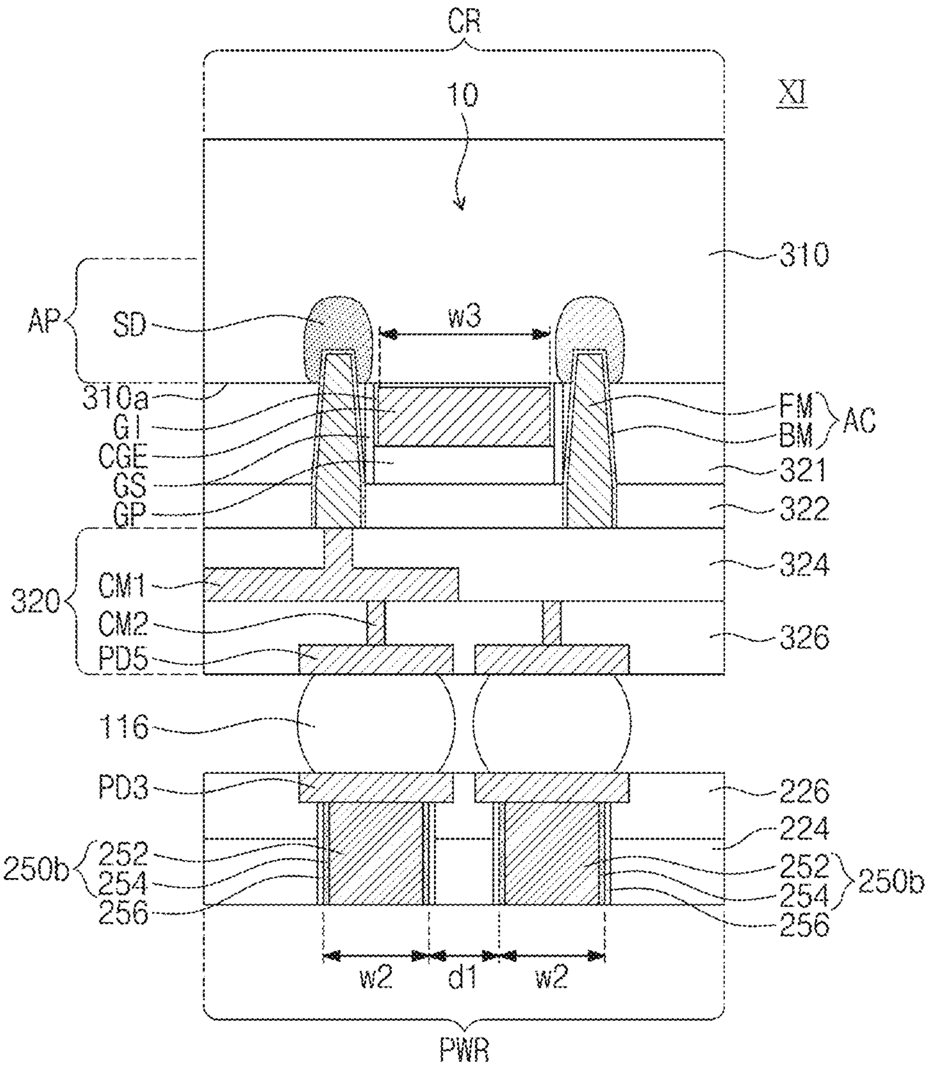
FIGS. 11 and 12 are enlarged sectional views illustrating portions 'XI' and 'XII', respectively, of FIG. 1.
Figure 12:
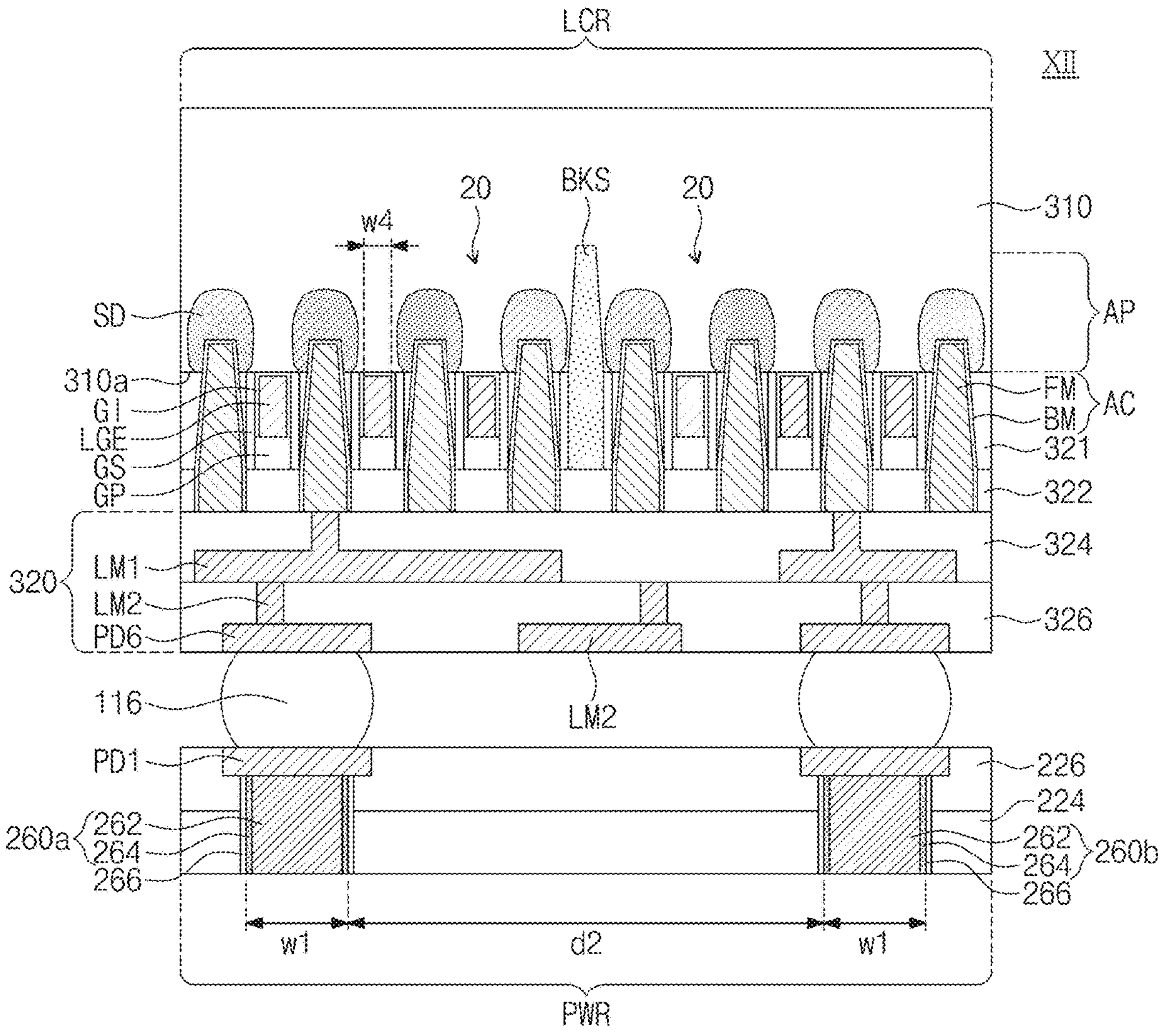

FIG. 9 is a bottom plan view illustrating a second active surface of a second semiconductor chip. FIG. 10 is an enlarged plan view illustrating a portion 'X' of FIG. 9. FIGS. 11 and 12 are enlarged sectional views illustrating portions 'XI' and 'XII', respectively, of FIG. 1.

Referring to FIGS. 1 and 9 to 12, the second semiconductor chip 300 may be bonded to a top surface of the first semiconductor chip 200 in a flip-chip manner A width of the second semiconductor chip 300 in the first direction D1 may be smaller than a width of the first semiconductor chip 200 in the first direction D1. In an example embodiment, the second semiconductor chip 300 may be covered with a mold layer (not shown) provided on the first active surface 210*a* of the first semiconductor chip 200.

The second substrate 310 of the second semiconductor chip 300 may include the core region CR and the logic cell region LCR. The core region CR of the second semiconductor chip 300 may be formed in a center portion of the second substrate 310, as shown in FIG. 9. The logic cell region LCR of the second semiconductor chip 300 may be provided to enclose the core region CR, when viewed in a plan view. The core region CR of the second semiconductor chip 300 may overlap the power wire region PWR of the first semiconductor chip 200. In an example embodiment, the core region CR of the second semiconductor chip 300 may fully or partially overlap the power wire region PWR of the first semiconductor chip 200. The core region CR of the second semiconductor chip 300 may include the power circuit 10 formed on the second active surface 310*a* of the second substrate 310. The power circuit 10 may overlap the power through electrodes 250 of the first semiconductor chip 200. The power circuit 10 may be electrically connected to the power through electrodes 250 of the first semiconductor chip 200 to receive a power voltage from the package substrate 100.

The logic cell region LCR of the second semiconductor chip 300 may vertically overlap the signal wire region SWR of the first semiconductor chip 200. The logic cell region LCR of the second semiconductor chip 300 may partially overlap the signal wire region SWR of the first semiconductor chip 200. The logic cell region LCR of the second semiconductor chip 300 may include the logic circuit 20. The logic circuit 20 of the second semiconductor chip 300 may vertically overlap the signal through electrodes 260 of the first semiconductor chip 200. The logic circuit 20 may be electrically connected to the package substrate 100 through the signal through electrodes 260.

The active patterns AP may be provided in a lower portion of the second substrate 310. The active patterns AP may be extended in the first direction D1 to be parallel to each other. The active patterns AP may be portions of the second substrate 310 which vertically protrude in a direction toward the first semiconductor chip 200. Each of the active patterns AP may be shaped like a fin.

The source/drain patterns SD may be provided on the active patterns AP of the core region CR and the logic cell region LCR. The source/drain patterns SD may be epitaxial patterns which are formed by a selective epitaxial growth process. As an example, bottom surfaces of the source/drain patterns SD may be coplanar with bottom surfaces of the channel patterns. As another example, the bottom surfaces of the source/drain patterns SD may be located at a level lower than the bottom surfaces of the channel patterns. The source/drain patterns SD may be formed of or include at least one of silicon (Si) or silicon germanium (SiGe). The channel pattern may be interposed between the source/drain patterns SD.

First gate electrodes LGE may be provided on the logic cell region LCR. The first gate electrodes LGE may be extended in the second direction D2 to cross the active patterns AP of the logic cell region LCR. The first gate electrodes LGE may be arranged at a specific pitch in the first direction D1. The first gate electrodes LGE may vertically overlap the channel patterns of the logic cell region LCR. Each of the first gate electrodes LGE may be provided to enclose each of the channel patterns of the logic cell region LCR or to face a top surface and opposite side surfaces of each of the channel patterns of the logic cell region LCR.

A second gate electrode CGE may be provided on the core region CR. The second gate electrode CGE may be extended in the second direction D2 to cross the active patterns AP of the core region CR. The second gate electrode CGE may vertically overlap the channel patterns of the core region CR. A width w3 of the second gate electrode CGE of the core region CR may be larger than a width w4 of the first gate electrode LGE of the logic circuit 20, when measured in the first direction D1. For example, the width w3 of the second gate electrode CGE may be about 5 to about 20 times the width w4 of the first gate electrode LGE, when measured in the first direction D1. For example, the width w4 of the first gate electrode LGE in the first direction D1 may range from about 5 nm to about 20 nm. For example, the width w4 of the second gate electrode CGE in the first direction D1 may range from about 50 nm to about 200 nm. The power circuit 10 on the core region CR may include a high voltage transistor, and the second gate electrode CGE may be a gate electrode of the high voltage transistor.

A separation structure BKS may be extended in the second direction D2 to cross the logic cell region LCR. The separation structure BKS may be extended to be parallel to the first gate electrodes LGE. The separation structure BKS may be formed between the logic circuits 20 to electrically separate two logic circuits 20 from each other. The separation structure BKS may be extended from a top surface of a fourth interlayer insulating layer 322 into the second substrate 310. The separation structure BKS may be formed of or include at least one of insulating materials (e.g., silicon oxide or silicon nitride).

The gate capping patterns GP may be provided on the first and second gate electrodes LGE and CGE. The gate capping patterns GP may be extended along the first and second gate electrodes LGE and CGE and in the second direction D2. The gate insulating layer GI may be interposed between the first gate electrode LGE and the active pattern AP and between the second gate electrode CGE and the active pattern AP.

A third interlayer insulating layer 321 may be provided on the second active surface 310*a* of the second substrate 310. The third interlayer insulating layer 321 may cover the gate spacers GS and the source/drain patterns SD. A bottom surface of the third interlayer insulating layer 321 may be substantially coplanar with the bottom surfaces of the gate capping patterns GP and the bottom surfaces of the gate spacers GS. The fourth interlayer insulating layer 322 may be provided on the bottom surface of the third interlayer insulating layer 321 to cover the gate capping patterns GP. The third interlayer insulating layer 321 and the fourth interlayer insulating layer 322 may be formed of or include silicon oxide.

The active contacts AC may be provided to penetrate the third interlayer insulating layer 321 and the fourth interlayer insulating layer 322 and may be electrically connected to the source/drain patterns SD, respectively. The active contact AC may include a conductive pattern FM and a barrier pattern BM enclosing the conductive pattern FM. The barrier pattern BM may be provided to cover side and bottom surfaces of the conductive pattern FM. The conductive pattern FM may be formed of or include at least one of metallic materials (e.g., aluminum (Al), copper (Cu), tungsten (W), molybdenum (Mo), and cobalt (Co)). The barrier pattern BM may include a metal nitride layer or may include a metal layer and a metal nitride layer. The metal layer may be formed of or include at least one of titanium (Ti), tantalum (Ta), tungsten (W), nickel (Ni), cobalt (Co), or platinum (Pt). The metal nitride layer may be formed of or include at least one of titanium nitride (TiN), tantalum nitride (TaN), tungsten nitride (WN), nickel nitride (NiN), cobalt nitride (CoN), or platinum nitride (PtN).

In an example embodiment, an interface layer may be interposed between the active contact AC and the source/drain pattern SD. The active contact AC may be electrically connected to the source/drain pattern SD through the interface layer. The interface layer may be formed of or include at least one of metal-silicide materials. For example, the interface layer may be formed of or include at least one of titanium silicide, tantalum silicide, tungsten silicide, nickel silicide, or cobalt silicide.

The second interconnection layer 320 may be provided on a bottom surface of a fourth interlayer insulating layer 422. The second interconnection layer 320 may include a first lower insulating layer 324, a second lower insulating layer 326, first and second core wire patterns CM1 and CM2, and first and second logic wire patterns LM1 and LM2. The first lower insulating layer 324 and the second lower insulating layer 326 may be formed of or include at least one of silicon oxide (SiO) or silicon nitride (SiN).

The first core wire patterns CM1 may be formed in the first lower insulating layer 324 of the core region CR and may be electrically connected to the active contact AC. The second core wire patterns CM2 may be formed in the second lower insulating layer 326 of the core region CR and may be electrically connected to the first core wire patterns CM1. The first core wire patterns CM1 and the second core wire patterns CM2 may be formed of or include at least one of metallic materials (e.g., copper (Cu), tungsten (W), aluminum (Al), or combinations thereof). For example, the first core wire patterns CM1 and the second core wire patterns CM2 may be copper patterns which are formed by a damascene process. A fifth pad PD5 may be formed on a bottom surface of each of the second core wire patterns CM2.

The first logic wire patterns LM1 may be formed in the first lower insulating layer 324 of the logic cell region LCR and may be electrically connected to the active contact AC. The second logic wire patterns LM2 may be formed in the second lower insulating layer 326 of the logic cell region LCR and may be electrically connected to the first logic wire patterns LM1. The first and second logic wire patterns LM1 and LM2 may be formed of or include the same material as the first and second core wire patterns CM1 and CM2.

Figure 13:
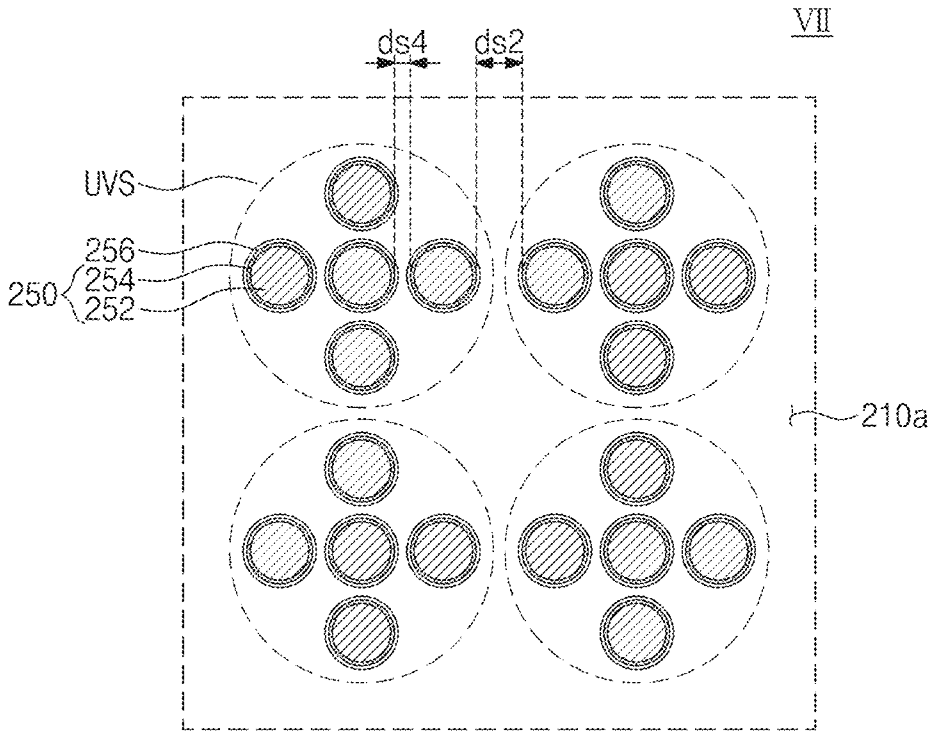
FIGS. 13 and 14 are plan views, each of which illustrates a portion of an active surface of a first semiconductor chip, corresponding to the portion 'VII' of FIG. 4, according to an example embodiment of the inventive concepts.
Figure 14:
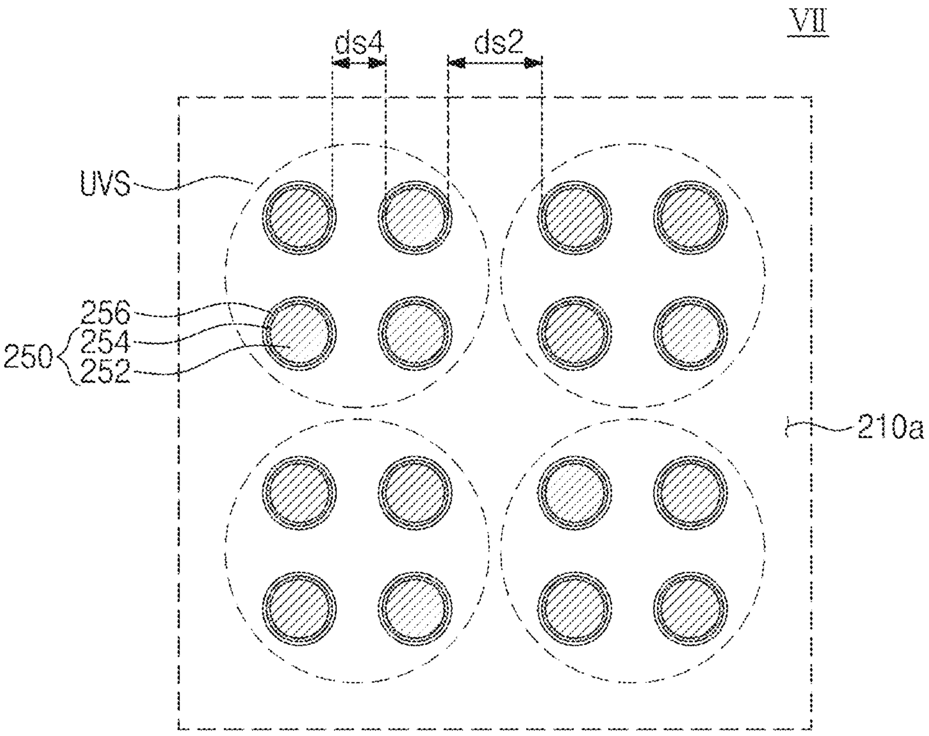

FIGS. 13 and 14 are plan views, each of which illustrates a portion of an active surface of a first semiconductor chip, corresponding to the portion 'VII' of FIG. 4, according to an example embodiment of the inventive concepts. For concise description, previously described elements may be identified by the same reference numbers without repeating an overlapping description thereof.

Referring to FIG. 13, each of the unit through electrode structures UVS may include five power through electrodes 250. The power through electrodes 250 may be arranged in a cross shape. A distance ds4 between a pair of the power through electrodes 250, which are provided in each of the through electrode structures UVS and are most adjacent to each other, may range from about 0.5 μm to about 2 μm. The distance ds4 between a pair of the power through electrodes 250, which are provided in each of the through electrode structures UVS and are most adjacent to each other, may be smaller than the distance ds2 between a pair of the power through electrodes 250, which are respectively provided in adjacent ones of the unit through electrode structures UVS. A distance between a pair of power through electrodes 250, which are provided in each of the through electrode structures UVS and are most adjacent to each other, may be smaller than a width of one of the power through electrodes 250.

Referring to FIG. 14, each of the unit through electrode structures UVS may include four power through electrodes 250. The power through electrodes 250 may be arranged to have a square or rectangular shape in the unit through electrode structure UVS.

Figure 15A:
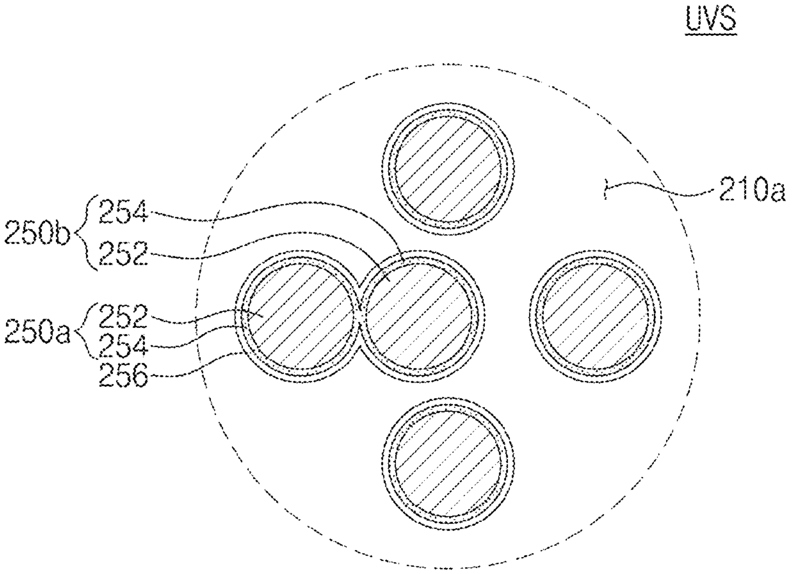
FIGS. 15A to 15C are enlarged plan views illustrating an active surface of a first semiconductor chip according to an example embodiment of the inventive concepts.
Figure 15B:
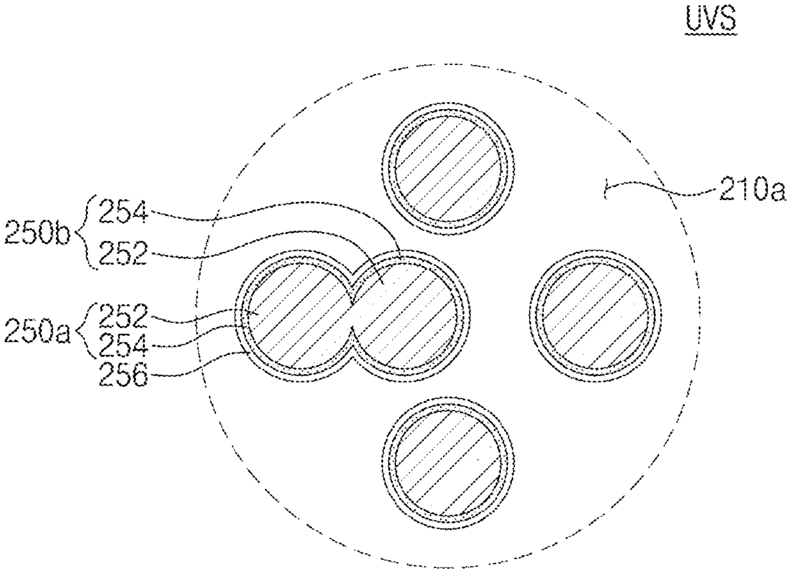
Figure 15C:
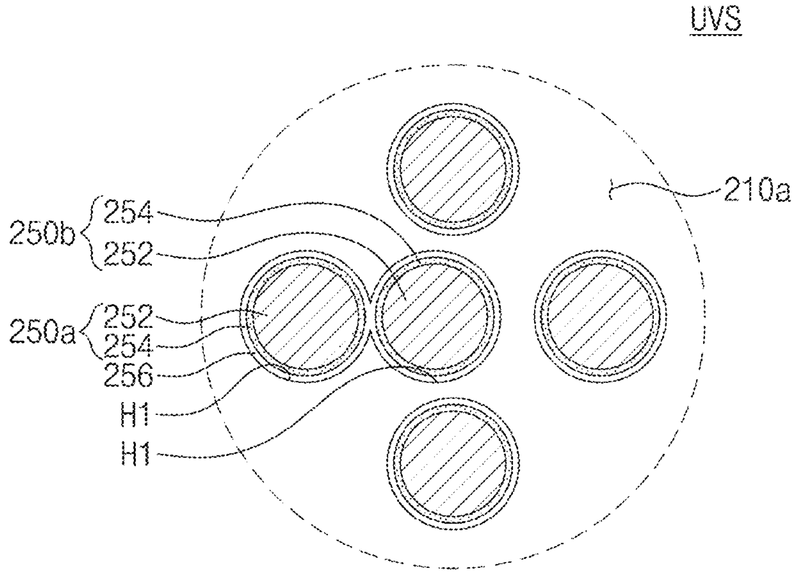

FIGS. 15A to 15C are enlarged plan views illustrating an active surface of a first semiconductor chip according to an example embodiment of the inventive concepts. For concise description, previously described elements may be identified by the same reference numbers without repeating an overlapping description thereof.

Referring to FIG. 15A, the unit through electrode structure UVS may include a first power through electrode 250*a* and a second power through electrode 250*b*, which are electrically connected to each other. The barrier pattern 254 of the first power through electrode 250*a* may be in contact with the barrier pattern 254 of the second power through electrode 250*b*. The conductive pattern 252 of the first power through electrode 250*a* and the conductive pattern 252 of the second power through electrode 250*b* may be spaced apart from each other, with the barrier pattern 254 interposed therebetween.

Referring to FIG. 15B, the unit through electrode structure UVS may include the first power through electrode 250*a* and the second power through electrode 250*b*, which are electrically connected to each other. The barrier pattern 254 of the first power through electrode 250*a* may be in contact with the barrier pattern 254 of the second power through electrode 250*b*. The conductive pattern 252 of the first power through electrode 250*a* may be in contact with the conductive pattern 252 of the second power through electrode 250*b*.

Referring to FIG. 15C, the unit through electrode structure UVS may include the first power through electrode 250*a* and the second power through electrode 250*b*, which are adjacent to each other with the insulating spacer 256 interposed therebetween.

Figure 16:
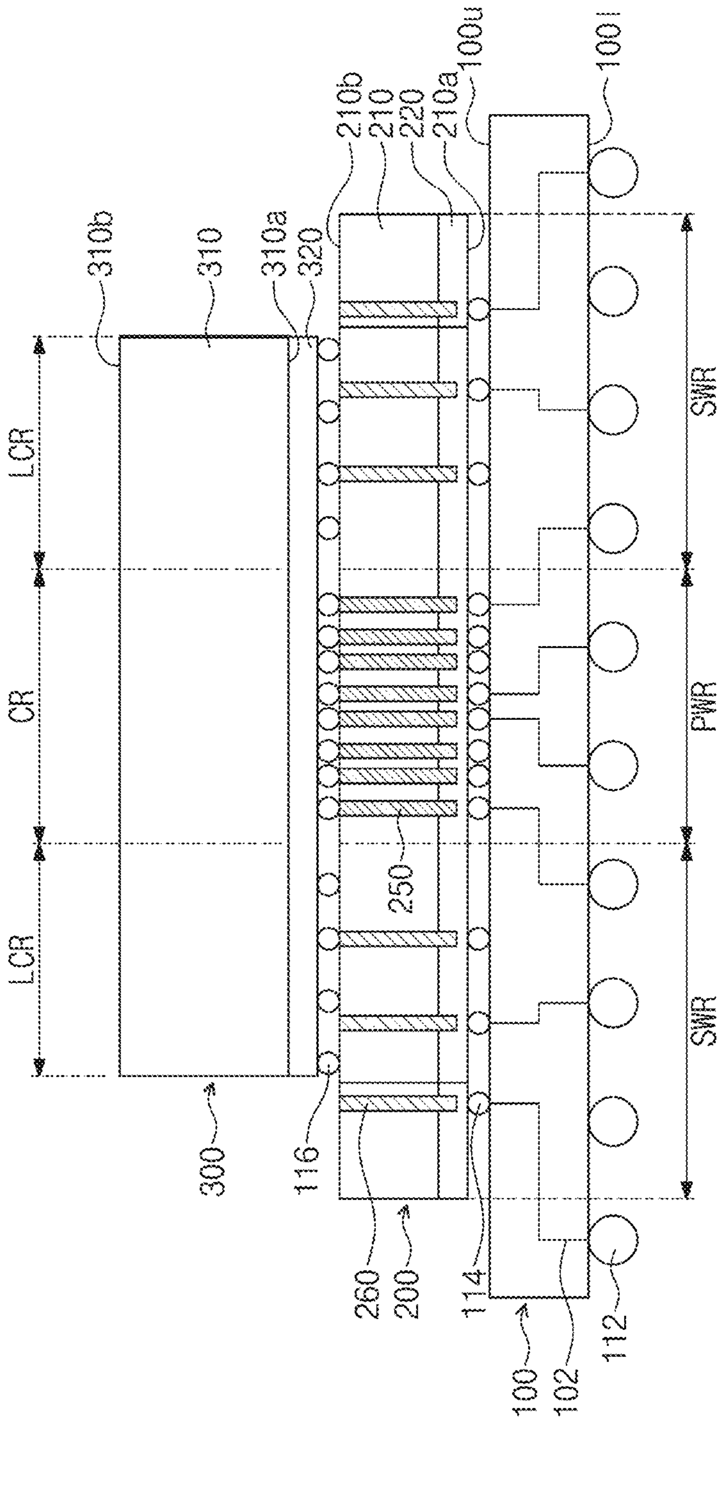
FIG. 16 is a sectional view illustrating a semiconductor package according to an example embodiment of the inventive concepts.

FIG. 16 is a sectional view illustrating a semiconductor package according to an example embodiment of the inventive concepts. For concise description, previously described elements may be identified by the same reference numbers without repeating an overlapping description thereof.

Referring to FIG. 16, the first semiconductor chip 200 and the second semiconductor chip 300 may be bonded to each other in a face-to-back manner. For example, the first active surface 210*a* of the first semiconductor chip 200 may face the package substrate 100, and the first inactive surface 210*b* of the first semiconductor chip 200 may face the second semiconductor chip 300. The first interconnection layer 220 of the first semiconductor chip 200 may be provided between the first substrate 210 and the package substrate 100. The second active surface 310*a* of the second semiconductor chip 300 may face the first inactive surface 210*b* of the first semiconductor chip 200.

According to an example embodiment of the inventive concepts, by adjusting positions of and distances between through electrodes, it may be possible to increase an integration density of a semiconductor package.

While some example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:

a package substrate;

an upper semiconductor chip disposed on the package substrate, the upper semiconductor chip comprising a core region having a power circuit thereon and a logic cell region having a logic circuit thereon; and a lower semiconductor chip disposed between the package substrate and the upper semiconductor chip such that the upper semiconductor chip, the lower semiconductor chip, and the package substrate are stacked sequentially along a first axis, the lower semiconductor chip comprising:

a first substrate including an active surface; and a power wire region overlapping the core region of the upper semiconductor chip when viewed along the first axis, the power wire region including a plurality of unit through electrode structures, each of the plurality of unit through electrode structures including a plurality of power through electrodes penetrating the first substrate and grouped in a diamond shape, and the plurality of unit through electrode structures being arranged in the power wire region with the diamond shapes adjacent to one another;

wherein the plurality of power through electrodes comprise a first through electrode and a second through electrode, and wherein a distance between the first through electrode and the second through electrode along a second axis perpendicular to the first axis is less than a width of the first through electrode along the second axis.

2. The semiconductor package of claim 1, wherein the first through electrode electrically connects the power circuit to the package substrate.

3. The semiconductor package of claim 1, wherein the lower semiconductor chip comprises an interlayer insulating layer covering the active surface of the first substrate and an interconnection layer on the interlayer insulating layer, and the first through electrode penetrates the interlayer insulating layer.

4. The semiconductor package of claim 1, wherein the lower semiconductor chip further comprises a signal wire region and signal through electrodes, the signal wire region enclosing the power wire region, the signal through electrodes penetrating the first substrate in the signal wire region, and the signal through electrodes are electrically connected to the active surface.

5. The semiconductor package of claim 1, wherein the logic circuit has a first gate electrode, the power circuit has a second gate electrode, and a width of the second gate electrode is larger than a width of the first gate electrode.

6. The semiconductor package of claim 5, wherein the width of the second gate electrode is 5 to 20 times the width of the first gate electrode.

7. The semiconductor package of claim 1, wherein the width of the first through electrode is 2 to 10 times the distance between the first and second through electrodes.

8. The semiconductor package of claim 1, wherein the first through electrode is electrically connected to the second through electrode.

9. The semiconductor package of claim 1, wherein the lower semiconductor chip comprises a signal wire region enclosing the power wire region and signal through electrodes penetrating the first substrate in the signal wire region, and a smallest distance between adjacent two of the signal through electrodes is larger than the distance between the first through electrode and the second through electrode.

10. The semiconductor package of claim 1, wherein the first through electrode comprises a conductive pattern having a pillar shape and a barrier pattern enclosing a side surface of the conductive pattern.

11. A semiconductor package, comprising:

a package substrate;

a lower semiconductor chip disposed on the package substrate, the lower semiconductor chip including a power wire region and a signal wire region that encloses the power wire region; and an upper semiconductor chip disposed on the lower semiconductor chip, the upper semiconductor chip including a core region overlapping the power wire region of the lower semiconductor chip when viewed along a first axis, wherein the lower semiconductor chip comprises:

a first substrate; and an integrated circuit disposed on the first substrate;

wherein the signal wire region includes a plurality of signal through electrodes penetrating the signal wire region and electrically connected to the integrated circuit, wherein the power wire region includes a plurality of unit through electrode structures, each of the plurality of unit through electrode structures including a grouping of power through electrodes penetrating the power wire region to electrically connect the core region to the package substrate, wherein the plurality of unit through electrode structures are disposed adjacent to one another within the power wire region, and wherein a distance between closest two power through electrodes within each grouping of power through electrodes in a second axis perpendicular to the first axis is less than a distance between closest two of the plurality of signal through electrodes in the second axis.

12. The semiconductor package of claim 11, wherein the plurality of signal through electrodes comprise a first signal through electrode and a second signal through electrode, and a distance between the first signal through electrode and the second signal through electrode is greater than a width of the first signal through electrode.

13. The semiconductor package of claim 11, wherein the lower semiconductor chip comprises an interconnection layer on the integrated circuit, and each grouping of power through electrodes at least partially penetrates the interconnection layer.

14. The semiconductor package of claim 11, wherein the grouping of power through electrodes is a first grouping of power through electrodes, wherein:

the upper semiconductor chip comprises a first gate electrode overlapping the plurality of signal through electrodes when viewed along the first axis and a second gate electrode overlapping a second grouping of power through electrodes when viewed along the first axis, and the second gate electrode has a width larger than the first gate electrode.

15. The semiconductor package of claim 14, wherein the width of the second gate electrode is 5 to 20 times a width of the first gate electrode.

16. A semiconductor package, comprising:

a package substrate;

a first semiconductor chip disposed on the package substrate, the first semiconductor chip including a power wire region and a signal wire region that encloses the power wire region; and a second semiconductor chip disposed on the first semiconductor chip, the second semiconductor chip including a core region and a logic cell region that encloses the core region, wherein the power wire region overlaps the core region of the second semiconductor chip when viewed along a first axis, wherein the first semiconductor chip comprises:

a first substrate;

an integrated circuit disposed on the first substrate;

an interlayer insulating layer covering the integrated circuit;

an interconnection layer disposed on the interlayer insulating layer;

one or more signal through electrodes disposed in the signal wire region, the one or more signal through electrodes penetrating the first substrate and the interlayer insulating layer; and a plurality of unit through electrode structures penetrating the power wire region to electrically connect the core region to the package substrate, wherein each of the plurality of unit through electrode structures comprises a plurality of power through electrodes, wherein the second semiconductor chip comprises:

a second substrate having an active surface facing the first semiconductor chip and an inactive surface opposite to the active surface;

a logic transistor disposed on the active surface positioned on the logic cell region;

a first power transistor disposed on the active surface positioned on the core region; and a second power transistor disposed adjacent to the first power transistor on the active surface positioned on the core region, and wherein:

the logic transistor comprises a first gate electrode having a first width along a second axis perpendicular to the first axis, the first gate electrode being electrically connected to a first signal through electrode of the one or more signal through electrodes, the first power transistor comprises a second gate electrode that has a second width along the second axis larger than the first width, the second gate electrode being electrically connected to the plurality of power through electrodes of a first unit through electrode structure of the plurality of unit through electrode structures; and the second power transistor comprises a third gate electrode electrically connected to the plurality of power through electrodes of a second unit through electrode structure of the plurality of unit through electrode structures.

17. The semiconductor package of claim 16, wherein the plurality of power through electrodes of the first unit through electrode structure overlap the first power transistor when viewed along the first axis.

18. The semiconductor package of claim 16, wherein the plurality of power through electrodes comprise a first power through electrode and a second power through electrode that are in contact with each other.

19. The semiconductor package of claim 16, wherein a first distance between two adjacent signal through electrodes is larger than a second distance between two adjacent power through electrodes.

20. The semiconductor package of claim 16, wherein the plurality of power through electrodes comprise a conductive pattern having a pillar shape, a barrier pattern enclosing a side surface of the conductive pattern, and an insulating spacer enclosing a side surface of the barrier pattern.

* * * * *